18B

(12) United States Patent
Yamamoto (10) Patent No.: US 8,025,968 B2
(45) Date of Patent: Sep. 27, 2011

(54) PRESSURE-SENSITIVE ADHESIVE SHEET FOR DICING AND METHOD FOR PROCESSING PROCESSED MATERIAL USING THE SAME

(75) Inventor: Shouji Yamamoto, Shizuoka (JP)

(73) Assignee: Nitto Denko Corporation, Osaka (JP)

( * ) Notice: Subject to any disclaimer, the term of this patent is extended or adjusted under 35 U.S.C. 154(b) by 346 days.

(21) Appl. No.: 11/757,452

(22) Filed: Jun. 4, 2007

(65) Prior Publication Data

US 2007/0281152 A1 Dec. 6, 2007
US 2009/0317633 A2 Dec. 24, 2009

(30) Foreign Application Priority Data

Jun. 2, 2006 (JP) ................. 2006-154717

(51) Int. Cl.
*B32B 27/08* (2006.01)
*B32B 27/32* (2006.01)
*B32B 7/12* (2006.01)

(52) U.S. Cl. ........ 428/343; 428/515; 428/516; 428/517; 428/519; 428/521

(58) Field of Classification Search .................. 428/343, 428/505
See application file for complete search history.

(56) References Cited

U.S. PATENT DOCUMENTS

| | | | | |
|---|---|---|---|---|
| 3,660,530 | A * | 5/1972 | Hoblit | 525/95 |
| 5,552,480 | A * | 9/1996 | Sugita et al. | 525/64 |
| 6,506,490 | B1 * | 1/2003 | Yamamoto | 428/343 |
| 7,141,300 | B2 | 11/2006 | Yamamoto et al. | |
| 2003/0031862 | A1 | 2/2003 | Yamamoto | |
| 2003/0096108 | A1 * | 5/2003 | Mussig et al. | 428/343 |
| 2005/0136251 | A1 * | 6/2005 | Kishimoto et al. | 428/343 |
| 2005/0208736 | A1 * | 9/2005 | Matsumura et al. | 438/460 |

FOREIGN PATENT DOCUMENTS

EP 0979852 A2 2/2000
(Continued)

OTHER PUBLICATIONS

Chinese Office Action issued on May 25, 2011 in the corresponding Chinese Patent Application No. 200710108213.6.

(Continued)

*Primary Examiner* — Callie E Shosho
*Assistant Examiner* — Samir Shah
(74) *Attorney, Agent, or Firm* — Sughrue Mion, PLLC (57) ABSTRACT

To provide a pressure-sensitive adhesive sheet for dicing which inhibits the generation of fibrous scraps and has good expandability. A pressure-sensitive adhesive sheet for dicing, which comprises a pressure-sensitive adhesive layer disposed on at least one surface of a base material, wherein the base material contains a polymer having a random copolymer block, and wherein the random copolymer block contains a block (I) containing, as a main constitutional unit, a constitution unit represented by the following structural formula (A) and a block (II) containing, as a main constitutional unit, a constitutional unit represented by the following structural formula (B)

$$-(CH_2-CH_2-CH_2-CH_2)-  \quad (A)$$

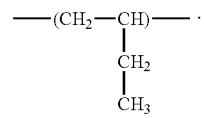

(B)

15 Claims, 1 Drawing Sheet

| FOREIGN PATENT DOCUMENTS | | |
|---|---|---|
| JP | 62-121781 A | 6/1987 |
| JP | 63-217642 A | 9/1988 |
| JP | 2-215528 A | 8/1990 |
| JP | 5-156214 A | 6/1993 |
| JP | 5-211234 A | 8/1993 |
| JP | 2618491 | 3/1997 |
| JP | 2003-257893 A | 12/2003 |
| JP | 2005-191297 A | 7/2005 |

OTHER PUBLICATIONS

Japanese Office Action issued on Jun. 28, 2011 in the corresponding Japanese Patent Application No. 2006-154717.

* cited by examiner

FIG. 1

PRESSURE-SENSITIVE ADHESIVE SHEET FOR DICING AND METHOD FOR PROCESSING PROCESSED MATERIAL USING THE SAME

FIELD OF THE INVENTION

The present invention relates to a pressure-sensitive adhesive sheet for dicing. Further, the invention relates to a method of performing dicing by using the pressure-sensitive adhesive sheet for dicing and to small pieces of a processed material obtainable by the dicing. The pressure-sensitive adhesive sheet for dicing of the invention is particularly useful as a pressure-sensitive adhesive sheet for dicing a semiconductor wafer, which is used for fixing the processed material such as the semiconductor wafer when the processed material such as the semiconductor wafer is cut and separated (diced) and when small pieces of the processed material which have been cut and separated are expanded and separated (picked up). For example, the pressure-sensitive adhesive sheet for dicing of the invention can be used as a pressure-sensitive adhesive sheet for dicing a silicon semiconductor, a pressure-sensitive adhesive sheet for dicing a compound semiconductor, a pressure-sensitive adhesive sheet for dicing a semiconductor package, a pressure-sensitive adhesive sheet for dicing glass, and the like.

BACKGROUND OF THE INVENTION

Conventionally, a semiconductor wafer made of silicon, gallium, arsenic or the like is produced in a state having a large diameter, then cut and separated (diced) into small element pieces, and further transferred to a mounting step. In this case, the semiconductor wafer is subjected to respective steps of a dicing step, a washing step, an expanding step, a pickup step and a mounting step in a state where the semiconductor wafer is stuck onto the pressure-sensitive adhesive sheet and retained thereby. As the above-mentioned pressure-sensitive adhesive sheet, there has been generally used a sheet in which an acrylic adhesive of about 1 to 200 µm in thickness is applied onto a base material composed of a plastic film.

The above-mentioned dicing step is usually performed using a round blade (dicing blade) which moves with rotating. In that case, cutting with the round blade is performed so that the blade reaches an inside of the base material of the pressure-sensitive adhesive sheet for dicing which retains the semiconductor package. At this time, when cutting is performed into the inside of the base material of the pressure-sensitive adhesive sheet, the plastic film itself as the base material generates fibrous scraps thereof. When the fibrous scraps are adhered to a side of a semiconductor chip, the semiconductor chip is mounted in a state where the fibrous scraps are adhered. As a result, the fibrous scraps have caused a problem of a significant reduction in quality of an electronic circuit.

As a means for solving such a problem, for example, JP-A-5-156214 (patent document 1) proposes a wafer sticking sheet using an ethylene-methacrylate copolymer as a base material. However, although this wafer sticking sheet inhibits the generation of fibrous scraps in some degree, it does not satisfy a level which is endurable in the dicing step performed for obtaining further highly reliable semiconductor devices.

Further, JP-A-5-211234 (patent document 2) discloses a pressure-sensitive adhesive sheet for wafer sticking using a polyolefinic film irradiated with an electron ray or a γ-ray at 1 to 80 MRad as a base material film. However, in this pressure-sensitive adhesive sheet for wafer sticking, the damage of the base material film caused by the radiation is extensive, and it is difficult to obtain a film excellent in appearance. Moreover, a great deal of cost is required in the production of the base material film.

Furthermore, JP-A-2003-257893 (patent document 3) discloses a pressure-sensitive adhesive sheet for dicing using a base material film which contains an olefinic thermoplastic elastomer containing propylene and ethylene and/or an α-olefin having 4 to 8 carbon atoms as polymerization components and having a melting point peak temperature of 120° C. to 170° C., and an ethylenic polymer containing ethylene as a main polymerization component. However, this pressure-sensitive adhesive sheet for dicing has the trade-off relation that the occurrence of whiskers can be reduced by an increase in the ratio of propylene contained in the base material film, whereas expandability is deteriorated. Namely, the above-mentioned constitution can inhibit the occurrence of fibrous scraps, but it is necessary to sacrifice expandability to some degree.

Furthermore, as a means for solving the problem of expandability, for example, JP-A-2-215528 (patent document 4) discloses a multilayer film for dicing in which a thermoplastic resin having rubber elasticity and an ethylenic resin layer are laminated with each other through a pressure-sensitive adhesive layer or directly. Further, it is described that the thermoplastic resin having rubber elasticity is a polybutene-1, polyurethane or polyester elastomer, or a saturated thermoplastic elastomer having a crystallinity of 5% to 50% and an average molecular weight of 80,000 or more, which is obtained by hydrogenating a 1,2-polybutadiene, styrene-butadiene-styrene or styrene-isoprene-styrene block copolymer. However, although this multilayer film for dicing improves expandability, a lot of fibrous scraps are generated in dicing. Accordingly, it is difficult to produce a semiconductor chip which secures high reliability.

Patent Document 1: JP-A-5-156214
Patent Document 2: JP-A-5-211234
Patent Document 3: JP-A-2003-257893
Patent Document 4: JP-A-2-215528

SUMMARY OF THE INVENTION

The invention intends to solve the problems associated with the conventional techniques as described above, and an object of the invention is to provide a pressure-sensitive adhesive sheet for dicing which inhibits the generation of fibrous scraps and has good expandability. Further, another object of the invention is to provide a method for processing a processed material, using the pressure-sensitive adhesive sheet for dicing. Furthermore, a further object of the invention is to provide a small piece of the processed material which is obtainable by the dicing method.

The present inventors have found that the above-mentioned objects can be achieved by using a polymer having a specific polymerization regularity as a constituent material of a base material film, thus arriving at completion of the invention.

DESCRIPTION OF REFERENCE NUMERALS AND SIGNS

10: Pressure-sensitive adhesive sheet for dicing
11: Base material film (base material)
12: Pressure-sensitive adhesive layer
13: Separator

DETAILED DESCRIPTION OF THE INVENTION

Namely, in order to solve the above-mentioned problems, the present invention relates to the following (1) to (9).

(1) A pressure-sensitive adhesive sheet for dicing, which comprises a base material and at least one pressure-sensitive adhesive layer disposed on at least one surface the base material,
wherein the base material contains a polymer having a random copolymer block, and
wherein the random copolymer block contains:
a block (I) containing, as a main constitutional unit, a constitutional unit represented by the following structural formula (A):

and a block (II) containing, as a main constitutional unit, a constitutional unit represented by the following structural formula (B):

(2) The pressure-sensitive adhesive sheet according to (1), wherein the block (I) and the block (II) are each contained in an amount within a range of from 30 to 70% by weight based on the weight of the polymer.

(3) The pressure-sensitive adhesive sheet according to (1), wherein the block (I) is a random copolymer block including the constitutional unit represented by the structural formula (A) and the constitutional unit represented by the structural formula (B), and
wherein the constitutional unit represented by the structural formula (A) is contained in an amount within a range of from 65 to 95% by weight, and the constitutional unit represented by the structural formula (B) is contained in an amount within a range of from 5 to 35% by weight.

(4) The pressure-sensitive adhesive sheet according to (1), wherein the block (II) is a random copolymer block including the constitutional unit represented by the structural formula (A) and the constitutional unit represented by the structural formula (B), and
wherein the constitutional unit represented by structural formula (A) is contained in an amount within a range of from 5 to 35% by weight, and the constitutional unit represented by structural formula (B) is contained in an amount within a range of from 65 to 95% by weight.

(5) The pressure-sensitive adhesive sheet according to (1), wherein the base material has a crystallinity of from 10 to 50% by weight.

(6) The pressure-sensitive adhesive sheet according to (1), wherein the base material is composed of a monolayer film, and contains the polymer in an amount of 50% by weight or more based on the total weight of the base material.

(7) The pressure-sensitive adhesive sheet according to (1), wherein the base material is composed of a multilayer film, and at least one layer of the multilayer film contains the polymer in an amount of 50% by weight or more based on the total weight of the layer.

(8) The pressure-sensitive adhesive sheet according to (1), wherein the pressure-sensitive adhesive layer contains a radiation-curable adhesive.

(9) The pressure-sensitive adhesive sheet according to (1), wherein the base material is a base material obtainable by polymerizing 1,3-butadiene as a main raw material monomer of the block (I) and 1,2-butadiene as a main raw material monomer of the block (II), followed by conducting a hydrogenation.

According to the above-mentioned constitution, the base material is constituted to include a random copolymer block having block (I) and block (II), so that it becomes possible to control the degree of crystallinity of the base material. As a result, the generation of fibrous scraps can be inhibited by controlling the crystallinity so as not to be excessively decreased, whereas a decrease in extension can be prevented by controlling the crystallinity so as not to be excessively increased. That is to say, the above-mentioned constitution can provide the pressure-sensitive adhesive sheet for dicing excellent in balance between inhibition of the generation of fibrous scraps and improvement in expandability.

The contents of the above-mentioned block (I) and block (II) are each preferably within a range of from 30 to 70% by weight based on the weight of the above-mentioned polymer.

When the content of the block (I) exceeds 70% by weight, or when the content of the block (II) is less than 30% by weight, extensibility is unfavorably decreased by an excessive increase in crystallinity of the base material, whereby expandability is decreased in some cases. Further, when the content of the block (I) is less than 30% by weight, or when the content of the block (II) exceeds 70% by weight, fibrous scraps are unfavorably generated in some cases by an excessive decrease in crystallinity of the base material.

It is preferred that the above-mentioned block (I) is a random copolymer block of a constitutional unit represented by the above-mentioned structural formula (A) and a constitutional unit represented by the above-mentioned structural formula (B), and that the content of the constitutional unit represented by the above-mentioned structural formula (A) is within a range of from 65 to 95% by weight, and the content of the constitutional unit represented by the above-mentioned structural formula (B) is within a range of from 5 to 35% by weight.

Further, it is preferred that the above-mentioned block (II) is a random copolymer block of a constitutional unit represented by the above-mentioned structural formula (A) and a constitutional unit represented by the above-mentioned structural formula (B), and that the content of the constitutional unit represented by the above-mentioned structural formula (A) is within a range of from 5 to 35% by weight, and the content of the constitutional unit represented by the above-mentioned structural formula (B) is within a range of from 65 to 95% by weight.

The crystallinity of the above-mentioned base material is preferably from 10 to 50% by weight. The crystallinity is a value measured using X-ray diffraction.

The above-mentioned base material is preferably composed of a monolayer film, and preferably contains the above-mentioned polymer in an amount of 50% by weight or more based on the total weight of the base material.

The above-mentioned base material is preferably composed of a multilayer film, and at least one layer of the multilayer film preferably contains the above-mentioned polymer in an amount of 50% by weight or more based on the total weight of the layer.

The above-mentioned pressure-sensitive adhesive layer preferably contains a radiation-curable adhesive.

In the case that the radiation-curable adhesive is contained in the pressure-sensitive adhesive layer, it is possible to decrease adhesive force of the pressure-sensitive adhesive layer by irradiation of a radiation. As a result, when a processed material is cut and separated to form small pieces of the processed material, followed by separation of the small pieces from the pressure-sensitive adhesive sheet for dicing, the separation can be easily performed.

The above-mentioned base material is preferably a base material obtainable by polymerizing 1,3-butadiene as a main raw material monomer of the block (I) and 1,2-butadiene as a main raw material monomer of the block (II), followed by conducting a hydrogenation.

According to the base material having the above-mentioned constitution, in block (I) containing the above-mentioned structural formula (A) as a main constitutional unit, polybutadiene having the structure of structural formula (A) by hydrogenation shows a structure similar to that of polyethylene. Moreover, the abundance ratio of the above-mentioned structural formula (B) is small, so that regularity is little disrupted, which makes it easy to induce crystallization in block (I).

On the other hand, in block (II) containing the above-mentioned structural formula (B) as a main constitutional unit, polybutadiene having the structure of structural formula (B) by hydrogenation shows a structure similar to that of polybutene. Moreover, the abundance ratio of the above-mentioned structural formula (A) is small, so that regularity is little disrupted, which makes it easy to induce crystallization in block (II). Accordingly, different from an ordinary hydrogenated product of a copolymer including 1,2-butadiene and 1,3-butadiene, a base material containing a random copolymer block having high crystallinity can be obtained.

Further, the present invention relates to the following (10) to (12).

(10) A method for processing a processed material, which comprises performing dicing of the processed material to which a pressure-sensitive adhesive sheet for dicing is stuck, thereby forming pieces of the processed material, wherein the pressure-sensitive adhesive sheet comprises a base material and at least one pressure-sensitive adhesive layer disposed on at least one surface the base material, wherein the base material contains a polymer having a random copolymer block, and wherein the random copolymer block contains:

a block (I) containing, as a main constitutional unit, a constitutional unit represented by the following structural formula (A):

(A)

and a block (II) containing, as a main constitutional unit, a constitutional unit represented by the following structural formula (B):

(B)

(11) The method according to (10), which further comprises expanding the pressure-sensitive adhesive sheet after the dicing, and then picking up the pieces of the processed material after the dicing from the pressure-sensitive adhesive sheet.

(12) The method according to (10), wherein the processed material is a semiconductor element.

According to the above-mentioned method, the processed material is diced using the pressure-sensitive adhesive sheet for dicing which is capable of inhibiting the generation of fibrous scraps from the base material, so that adhesion of fibrous scraps to the small pieces of the processed material after dicing can be decreased. Accordingly, significant deterioration of quality of the small pieces of the processed material can be inhibited, whereby the yield can be thus improved.

Further, in the above-mentioned method, the above-mentioned pressure-sensitive adhesive sheet for dicing is expanded after the dicing has been performed, and small pieces of the processed material after cutting can be picked up from the pressure-sensitive adhesive sheet for dicing.

The pressure-sensitive adhesive sheet for dicing used in this method inhibits the generation of fibrous scraps and has good expandability, so that the spacing between the small pieces of the processed material which are adjacent to each other can be sufficiently secured when the pressure-sensitive adhesive sheet for dicing is expanded, thereby being able to prevent the small pieces of the processed material from causing damaging to each other in the course of picking up. Thus, the yield can be further improved.

As the above-mentioned processed material, a semiconductor element can be used.

Furthermore, the present invention relates to the following (13).

(13) A piece of a processed material obtainable by the method according to (10).

The invention accomplishes advantages as described below according to the means described above.

Namely, according to the pressure-sensitive adhesive sheet for dicing of the invention, since a base material containing a random copolymer block of block (I) containing the above-mentioned structural formula (A) as a main constitutional unit and block (II) containing the above-mentioned structural formula (B) as a main constitutional unit is employed, it is possible to control the degree of crystallinity of the base material. As a result, the pressure-sensitive adhesive sheet for dicing excellent in balance between inhibition of the generation of fibrous scraps and expandability can be provided.

Further, according to the method for processing a processed material of the invention, since the processed material is processed using the above-mentioned adhesive sheet for dicing, the generation of fibrous scraps is inhibited in dicing the processed material and good expandability is exerted in expanding. As a result, adhesion of fibrous scraps to small pieces of the processed material is inhibited. Thus, the yield can be improved, and the production cost can be decreased.

Figure 1:
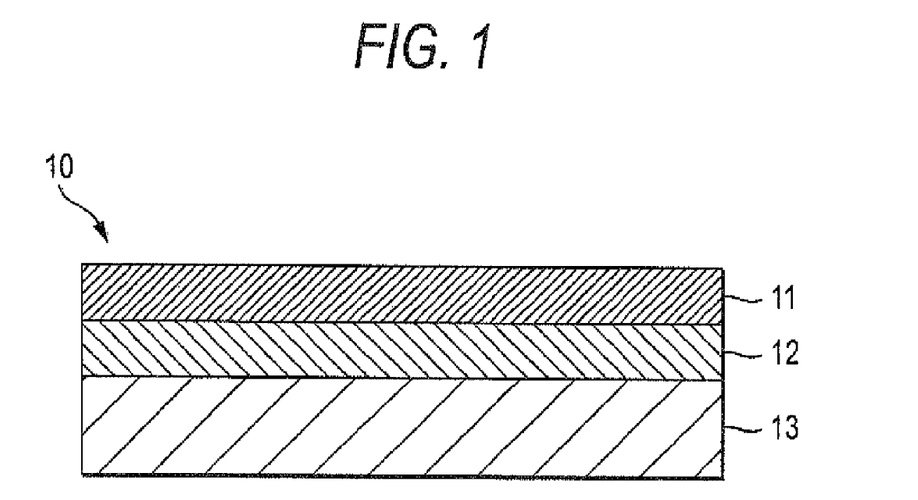
FIG. 1 is a schematic cross-sectional view showing an outline of a pressure-sensitive adhesive sheet for dicing according to one embodiment of the invention.

The pressure-sensitive adhesive sheet for dicing according to one embodiment of the invention will be illustrated in detail below with reference to FIG. 1. FIG. 1 is a schematic cross-sectional view showing an outline of the pressure-sensitive adhesive sheet for dicing (hereinafter referred to as the pressure-sensitive adhesive sheet) according to one embodiment of the invention. As shown in FIG. 1, the pressure-sensitive adhesive sheet 10 has a constitution in which a pressure-sensitive adhesive layer 12 and a separator 13 are laminated on one surface of a base material film (base material) 11 in this order.

The pressure-sensitive adhesive sheet may take an appropriate form depending on its application, such as a sheet form or a roll form. For example, in the case of a dicing application of a semiconductor wafer, one previously cut to a specified form can be preferably used. In this embodiment, a description is given taking as an example the sheet in which the pressure-sensitive adhesive layer 12 is provided on only one surface of the base material film 11, but the invention should not be construed as being limited thereto. For example, the pressure-sensitive adhesive layers 12 may be provided on both surfaces of the base material film 11.

The base material film 11 sustains the strength of the pressure-sensitive adhesive sheet 10. The base material film 11 includes a polymer having a random copolymer block. The random copolymer block has block (I) and block (II). Further, block (I) contains a constitutional unit represented by the following structural formula (A):

as a main constitutional unit, and block (II) contains a constitutional unit represented by the following structural formula (B):

as a main constitutional unit.

When the base material film 11 is composed of a monolayer film, the above-mentioned polymer having the random copolymer block is preferably contained in an amount of 50% by weight or more. On the other hand, when the base material film 11 is composed of a multilayer film, at least one layer of the multilayer film preferably contains the above-mentioned polymer in an amount of 50% by weight or more.

The block (I) containing the constitutional unit represented by the above-mentioned structural formula (A) as a main constitutional unit is formed using, for example, 1,3-butadiene as a main constitutional monomer, and the block (II) containing the constitutional unit represented by the above-mentioned structural formula (B) as a main constitutional unit is formed using, for example, 1,2-butadiene as a main constitutional monomer.

The contents of the above-mentioned block (I) and block (II) are each preferably within the range of 30 to 70% by weight based on the weight of the random copolymer. When the content of the block (I) exceeds 70% by weight, or when the content of the block (II) is less than 30% by weight, extensibility is unfavorably decreased by an excessive increase in crystallinity of the base material, whereby expandability is decreased in some cases. Further, when the content of the block (I) is less than 30% by weight, or when the content of the block (II) exceeds 70% by weight, fibrous scraps are unfavorably generated in some cases by an excessive decrease in crystallinity of the base material.

The constitutional unit represented by the above-mentioned structural formula (B) may be contained in the above-mentioned block (I). In this case, it is preferred that the content of the constitutional unit represented by the above-mentioned structural formula (A) is within a range of from 65 to 95% by weight, and that the constitutional unit represented by the above-mentioned structural formula (B) is within a range of from 5 to 35% by weight.

The constitutional unit represented by the above-mentioned structural formula (A) may be contained in the above-mentioned block (II). In this case, it is preferred that the content of the constitutional unit represented by the above-mentioned structural formula (A) is within a range of from 5 to 35% by weight, and that the constitutional unit represented by the above-mentioned structural formula (B) is within a range of from 65 to 95% by weight.

The above-mentioned polymer has high stereoregularity due to the structure thereof, and crystallization in the random copolymer block is liable to occur. Accordingly, the above-mentioned polymer has relatively high crystallinity. The crystallinity of the above-mentioned base material film 11 is preferably from 10 to 50% by weight. When the crystallinity is less than 10% by weight, fibrous scraps are unfavorably generated in some cases. On the other hand, when the crystallinity exceeds 50% by weight, expandability is deteriorated to unfavorably cause breakage of the base material film 11 in expanding in some cases.

In order to enhance adhesion and retention to an adjacent layer, a surface of the base material film 11 may be subjected to a conventional surface treatment, for example, chemical or physical treatment such as chromic acid treatment, ozone exposure, flame exposure, high-pressure electric shock exposure or ionized radiation treatment, or coating treatment with a primer (for example, an adhesive material described later).

In order to impart antistatic ability to the base material film 11, a deposited layer (about 30 to 500 angstroms in thickness) made of a conductive material such as a metal, an alloy or an oxide thereof may be provided on the above-mentioned base material film 11. The base material film 11 may be either a monolayer or a multilayer including two or more kinds of layers. When the pressure-sensitive adhesive layer 12 described later is of a radiation-curable type, there is used a layer which allows a radiation such as an X-ray, an ultraviolet ray or an electron beam to at least partially permeate.

Although the thickness of the base material film 11 can be appropriately determined without any particular limitation, it is generally about from 10 to 300 μm, preferably about from 25 to 200 μm, and more preferably about from 30 to 200 μm.

In the base material film 11, various additives, for example, a softener such as mineral oil, a filler such as calcium carbonate, silica, talc, mica or clay, an antioxidant, a light stabilizer, an antistatic agent, a lubricant, a dispersing agent and a neutralizing agent may be optionally blended. Further, the base material film 11 may be optionally subjected to uniaxial or biaxial stretching treatment. Furthermore, the base material film 11 can be optionally subjected to a conventional physical or chemical treatment such as matting treatment, corona discharge treatment or primer treatment.

The base material film 11 may be produced, for example, in the following manner. That is to say, a random copolymer having the structural formula (A) as a main constitutional unit is first produced in the presence of 65 to 95% by weight of 1,3-butadiene and 5 to 35% by weight of 1,2-butadiene. Then, a random copolymer having the structural formula (B) as a main constitutional unit is produced in the presence of 65 to 95% by weight of 1,2-butadiene and 5 to 35% by weight of 1,3-butadiene. Thereafter, hydrogenation is performed under specified conditions to remove remaining double bonds, thereby preparing a material for forming the base material film 11. In this regard, the preparation method of the material for forming the base material film 11 should not be construed as being limited to the above.

Film formation of the base material film 11 can be performed by a conventional film forming method, using the above-mentioned forming material. As the film forming method, there is exemplified, for example, calender film formation, casting film formation, inflation extrusion, T-die extrusion or the like.

As the adhesive constituting the pressure-sensitive adhesive layer 12, there can be used a pressure-sensitive adhesive which has been generally used. Specifically, there may be used various adhesives such as a rubber-based adhesive, an acrylic adhesive, a silicone-based adhesive, a polyester-based adhesive and a polyvinyl acetate-based adhesive. As the above-mentioned adhesive, preferred is a (meth)acrylic adhesive having a (meth)acrylic polymer as a base polymer, in terms of adhesiveness to a semiconductor wafer or a semiconductor package as the processed material, cleaning properties of a semiconductor wafer or the like with ultrapure water or an organic solvent such as an alcohol, and the like. As the (meth)acrylic polymer, there is ordinarily used a polymer of an alkyl (meth)acrylate or a copolymer thereof with a copolymerizable monomer. As a main monomer of the (meth)acrylic polymer, preferred is an alkyl (meth)acrylate whose homopolymer has a glass transition temperature of 20° C. or less. In this regard, the alkyl (meth)acrylate means an alkyl acrylate and/or an alkyl methacrylate, and the term (meth) used in the present specification unexceptionally has the same meaning.

Examples of the above-mentioned (meth)acrylic polymers include (meth)acrylic polymers in which one or two or more of alkyl esters of (meth)acrylic acid (for example, alkyl esters having 1 to 30 carbon atoms, particularly straight-chain or branched alkyl esters having 4 to 18 carbon atoms, such as a methyl ester, an ethyl ester, a propyl ester, an isopropyl ester, a butyl ester, an isobutyl ester, a s-butyl ester, a t-butyl ester, a pentyl ester, an isopentyl ester, a hexyl ester, a heptyl ester, an octyl ester, a 2-ethylhexyl ester, an isooctyl ester, an isononyl ester, a decyl ester, an isodecyl ester, an undecyl ester, a dodecyl ester, a tridecyl ester, a tetradecyl ester, a hexadecyl ester, an octadecyl ester and an eicocyl ester), cycloalkyl esters of (meth)acrylic acid (for example, a cyclopentyl ester and a cyclohexyl ester), hydroxyalkyl esters of (meth)acrylic acid (for example, a hydroxyethyl ester, hydroxybutyl ester and a hydroxyhexyl ester), glycidyl (meth)acrylate, (meth)acrylic acid, itaconic acid, maleic anhydride, (meth)acrylic acid amide, (meth)acrylic acid N-hydroxymethylamide, alkylaminoalkyl esters of (meth) acrylic acid (for example, dimethylaminoethyl methacrylate and t-butylaminoethyl methacrylate), vinyl acetate and styrene are used as monomer components.

In order to modify cohesion force, adhesiveness or the like, the above-mentioned (meth)acrylic polymer may contain a unit corresponding to another monomer component copolymerizable with the above-mentioned alkyl ester or cycloalkyl ester of (meth)acrylic acid, according to the necessity. Examples of such monomer components include carboxyl group-containing monomers such as acrylic acid, methacrylic acid, carboxyethyl (meth)acrylate, carboxypentyl (meth)acrylate, itaconic acid, maleic acid, fumaric acid and crotonic acid; acid anhydride monomers such as maleic anhydride and itaconic anhydride; hydroxyl group-containing monomers such as 2-hydroxyethyl (meth)acrylate, 2-hydroxypropyl (meth)acrylate, 4-hydroxybutyl (meth)acrylate, 6-hydroxyhexyl (meth)acrylate, 8-hydroxyoctyl (meth)acrylate, 10-hydroxydecyl (meth)acrylate, 12-hydroxylauryl (meth)acrylate and (4-hydroxymethylcyclohexyl)methyl (meth)acrylate; sulfonic acid group-containing monomers such as styrenesulfonic acid, allylsulfonic acid, 2-(meth)acrylamido-2-methylpropanesulfonic acid, (meth)acrylamidopropanesulfonic acid, sulfopropyl (meth)acrylate and (meth)acryloyloxynaphthalenesulfonic acid; phosphoric acid-containing monomers such as 2-hydroxyethylacryloyl phosphate; acrylamide, acrylonitrile and the like. These copolymerizable monomer components can be used either alone or as a mixture of two or more thereof. The amount of these copolymerizable monomers used is preferably 30% by weight or less, and more preferably 15% by weight or less, based on the total monomer components.

Further, the above-mentioned (meth)acrylic polymer may also contain a multifunctional monomer or the like as a monomer component for copolymerization according to the necessity, in order to crosslink this polymer. Self-sustaining properties of the pressure-sensitive adhesive layer is improved by crosslinking the base polymer, so that large deformation of the pressure-sensitive adhesive sheet can be prevented, which makes it easy to maintain a flat plate form of the pressure-sensitive adhesive sheet 10.

Examples of the multifunctional monomers include hexanediol di(meth)acrylate, (poly)ethylene glycol di(meth) acrylate, (poly)propylene glycol di(meth)acrylate, neopentyl glycol di(meth)acrylate, pentaerythritol di(meth)acrylate, trimethylolpropane tri(meth)acrylate, pentaerythritol tri(meth) acrylate dipentaerythritol hexa(meth)acrylate, epoxy (meth) acrylate, polyester (meth)acrylate, and urethane (meth) acrylate. These multifunctional monomers can also be used either alone or as a mixture of two or more thereof. The amount of the multifunctional monomer is preferably 30% by weight or less based on the total monomer components, in terms of adhesive characteristics and the like.

The above-mentioned (meth)acrylic polymer is obtained by polymerizing a single monomer or a mixture of two or more kinds of monomers. Polymerization can be conducted by any system of solution polymerization, emulsion polymerization, bulk polymerization, suspension polymerization and photopolymerization. In particular, when polymerization is conducted by irradiation of a radiation such as an ultraviolet ray or an electron beam, it is preferred that a liquid composition obtained by blending the monomer component and a photopolymerization initiator with a urethane (meth)acrylate-based oligomer is cast and photopolymerized, thereby synthesizing the (meth)acrylic polymer.

The above-mentioned urethane (meth)acrylate-based oligomer has a number average molecular weight of about 500 to 100,000, preferably 1,000 to 30,000, and is a bifunctional compound having an ester diol as a main skeleton. Further, the examples of the monomer components include morpholine (meth)acrylate, isobonyl (meth)acrylate, dicyclopentanyl (meth)acrylate, dicyclopentenyl (meth)acrylate, and methoxylated cyclodecatriene (meth)acrylate. The mixing ratio of the urethane (meth)acrylate-based oligomer to the monomer component is preferably from 95:5 to 5:95, and more preferably from 50:50 to 70:30. When the content of the urethane (meth)acrylate-based oligomer is high, the viscosity of the liquid composition increases to cause the tendency of polymerization to become difficult.

In terms of contamination prevention and the like of the processed material, it is preferred that the content of a low molecular weight material in the pressure-sensitive adhesive layer 12 is low. In view of this, the number average molecular weight of the (meth)acrylic polymer is preferably about from 200,000 to 3,000,000, and more preferably about from 250,000 to 1,500,000.

Further, in order to increase the number average molecular weight of the (meth)acrylic polymer as the base polymer, an external crosslinking agent may also be appropriately employed in the above-mentioned adhesive. Specific means of external crosslinking methods include a method of adding a so-called crosslinking agent such as a polyisocyanate compound, a melamine resin, a urea resin an epoxy resin or a polyamine carboxyl group-containing polymer and allowing it to react. When the external crosslinking agent is used, the amount thereof used is appropriately determined depending on the balance with the base polymer to be crosslinked, and further depending on its application as an adhesive. In general, it is preferably blended in an amount of about 1 to 5 parts by weight based on 100 parts by weight of the above-mentioned base polymer. Further, various additives such as a tackifier and an antiaging agent which have hitherto been known, as well as the above-mentioned components, may be optionally used in the adhesive.

Furthermore, as the above-mentioned adhesive, the radiation-curable adhesive can be used. As the radiation-curable adhesive, there can be used one having a radiation-curable functional group such as a carbon-carbon double bond and showing adhesion, without any particular limitation. As the radiation-curable adhesive, desirable is an ultraviolet-curable adhesive which decreases in adhesive force by ultraviolet irradiation. According to such a pressure-sensitive adhesive layer 12, the pressure-sensitive adhesive sheet 10 can be easily separated by ultraviolet irradiation after a back-grinding step or a dicing step.

The ultraviolet-curable adhesive can be constituted, for example, by a homopolymer of the above-mentioned (meth)acrylic acid ester or a copolymer thereof with a copolymerizable comonomer (an acrylic polymer), an ultraviolet-curable component (which may be one obtained by adding a carbon-carbon double bond to a side chain of the above-mentioned acrylic polymer), a photopolymerization initiator, and optional conventional additives such as a crosslinking agent, a tackifier, a filler, an antiaging agent and a coloring agent.

The above-mentioned ultraviolet-curable component may be any one, so long as it is a monomer, oligomer or polymer having a carbon-carbon double bond in the molecule thereof and curable by radical polymerization. Specific examples thereof include esters of polyvalent alcohols and (meth)acrylic acid, such as a urethane oligomer, urethane (meth)acrylate, tetramethylolmethane tetra(meth)acrylate, trimethylolpropane tri(meth)acrylate, pentaerythritol tri(meth)acrylate, pentaerythritol tetra(meth)acrylate, dipentaerythritol monohydroxy penta(meth)acrylate, dipentaerythritol hexa(meth)acrylate, 1,4-butanediol di(meth)acrylate, tetraethylene glycol di(meth)acrylate and 1,6-hexanediol di(meth)acrylate; acrylate oligomers; and isocyanurate or isocyanurate compounds such as 2-propenyl-di-3-butenyl cyanurate, 2-hydroxyethylbis(2-acryloxyethyl) isocyanurate and tris(2-methacryloxyethyl) isocyanurate. When the ultraviolet-curable polymer having a carbon-carbon double bond on the side chain of the polymer is employed as an acrylic polymer, it is unnecessary to particularly add the above-mentioned ultraviolet-curable component. The amount of the ultraviolet-curable monomer or oligomer component blended is, for example, about from 20 to 200 parts by weight, and preferably about from 50 to 150 parts by weight, based on 100 parts by weight of the base polymer such as the (meth)acrylic polymer constituting the adhesive.

Further, examples of the radiation-curable adhesives include, in addition to the addition type radiation curable adhesive described above, an internal type radiation-curable adhesive using as the base polymer a polymer having a carbon-carbon double bond on a side chain of the polymer, in a main chain thereof or at a terminal end of the main chain. The internal type radiation-curable adhesive is not required to contain the oligomer component or the like as a low molecular weight component, or does not contain it in large amounts, so that the oligomer component or the like does not move in the adhesive with time. Accordingly, the pressure-sensitive adhesive layer 12 having a stable layer structure can be formed.

As the above-mentioned carbon-carbon double bond-containing base polymer, there can be used one having a carbon-carbon double bond and having adhesion property without any particular limitation. As such a base polymer, preferred is one having the (meth)acrylic polymer as a basic skeleton. Examples of the basic acrylic polymer skeleton include the (meth)acrylic polymers exemplified above.

When the carbon-carbon double bond is introduced into the polymer side chain in the above-mentioned (meth)acrylic polymer, molecular design becomes easy. A method for introducing the carbon-carbon double bond is not particularly limited, and various methods can be employed. For example, there is mentioned a method of previously copolymerizing a functional group-containing monomer with the (meth)acrylic polymer, and then allowing a compound having a functional group reactable with the above functional group and the carbon-carbon double bond to react by condensation or addition while maintaining radiation curability of the carbon-carbon double bond.

Examples of combinations of these functional groups include a carboxylic acid group and an epoxy group, a carboxylic acid group and an aziridyl group, and a hydroxyl group and an isocyanate group. Among these combinations of the functional groups, the combination of a hydroxyl group and an isocyanate group is suitable from the viewpoint of easy tracing of the reaction. Further, by combining these functional groups, the functional group may be either on the side of the (meth)acrylic polymer or on the side of the above-mentioned compound, so long as it is such a combination that the above-mentioned carbon-carbon bond-containing (meth)acrylic polymer is formed. However, in the above-mentioned preferred combination, the case where the (meth)acrylic polymer has the hydroxyl group and the above-mentioned compound has the isocyanate group is suitable. In this case, examples of the carbon-carbon double bond-containing isocyanate compounds include methacryloyl isocyanate, 2-methacryloyloxyethyl isocyanate, and m-isopropenyl-$\alpha,\alpha$-dimethylbenzyl isocyanate. Further, examples of the (meth)acrylic polymers include the hydroxy group-containing monomers exemplified above, and copolymers obtained by copolymerizing ether-based compounds such as 2-hydroxyethyl vinyl ether, 4-hydroxybutyl vinyl ether and diethylene glycol monovinyl ether.

As the above-mentioned internal type radiation-curable adhesive, the above-mentioned carbon-carbon double bond-containing base polymer (particularly, the (meth)acrylic polymer) may be used solely. Further, the above-mentioned radiation-curable monomer or oligomer component may be blended in such a degree that the characteristics are not deteriorated. The amount of the radiation-curable oligomer component or the like blended is usually 30 parts by weight or less, and preferably 10 parts by weight or less, based on 100 parts by weight of the base polymer.

The above-mentioned polymerization initiator may be any one, so long as it is a substance which cleaves by irradiation of an ultraviolet ray having an appropriate wavelength acting as a trigger for the polymerization reaction to form a radical. Specific examples thereof include benzoin alkyl ethers such as benzoyl methyl ether, benzoin isopropyl ether and benzoin isobutyl ether; aromatic ketones such as benzyl, benzoin, benzophenone and α-hydroxycyclohexyl phenyl ketone; aromatic ketals such as benzyl dimethyl ketal; polyvinyl benzophenone; and thioxanthones such as chlorothioxanthone, dodecylthioxanthone, dimethylthioxanthone and diethylthioxanthone. The amount of the polymerization initiator blended is about from 0.1 to 20 parts by weight, and preferably from 1 to 10 parts by weight, based on 100 parts by weight of the base polymer such as the (meth)acrylic polymer or the like constituting the adhesive.

On the other hand, examples of the above-mentioned heat-releasable adhesives include a heat foaming type adhesive in which fine heat-expandable particles are blended with a general pressure-sensitive adhesive. The pressure-sensitive adhesive layer 12 foams or expands by heating the pressure-sensitive adhesive containing the fine heat-expandable particles after the object of adhering an article has been attained, to change a surface of the pressure-sensitive adhesive layer 12 to an uneven form, thus decreasing adhesive force by a decrease in adhered area with an adherend, which makes the article easily separable. This has therefore been used for a wide variety of purposes, such as fixing in processing electronic parts, materials therefor or the like and physical distribution such as conveyance.

There is no particular limitation on the fine heat-expandable particles, and various inorganic or organic heat-expandable microspheres can be selected to use so that a combination of microspheres having different release initiation temperatures, a low release initiation temperature and a high release initiation temperature, is obtained. The difference in release separation temperature between these two types of heat-expandable microspheres can be appropriately determined depending on processing accuracy such as temperature-sensitive characteristics of the heat-expandable microspheres. However, the difference between these temperatures is set generally from 20 to 70° C., and preferably from 30 to 50° C.

In the heat foaming type adhesive, the adhered area decreases by foaming of the fine heat-expandable particles due to heat to make separation easy. The average particle size of the fine heat-expandable particles is preferably about from 1 to 25 μm, more preferably from 5 to 15 μm, and particularly preferably about 10 μm.

As the fine heat-expandable particles, a material expandable under heating can be used without any particular limitation. However, fine heat-expandable particles obtained by microencapsulating a heat-expandable material are preferably used in terms of an easy mixing operation and the like. For example, they may be used any one, so long as they are microspheres in which a material easily gasified by heating, such as isobutane, propane or pentane, is encapsulated in shells having elasticity. The above-mentioned shells are usually formed by a thermoplastic material, a thermofusible material, a material which bursts by heat expansion or the like. The materials for forming the above-mentioned shells include, for example, a vinylidene chloride-acrylonitrile copolymer, polyvinyl alcohol, polyvinyl butyral, polymethyl methacrylate, polyacrylonitrile polyvinylidene chloride, and polysulfone. The heat-expandable microcapsules have an advantage of excellent dispersion mixability with the above-mentioned adhesive. Commercially available products of the heat-expandable microcapsules include, for example, Microsphere (trade name: manufactured by Matsumoto Yushi-Seiyaku Co., Ltd.). In addition, a heat expansion aid may be optionally added.

For the amount of the fine heat-expandable particles (heat-expandable microcapsules) blended with the above-mentioned adhesive, an amount which can decrease its adhesive force can be appropriately determined depending on the kind of the above-mentioned pressure-sensitive adhesive layer 12. In general, the fine heat-expandable particles are blended in an amount which can maintain the thickness of the pressure-sensitive adhesive layer 12 containing the fine heat-expandable particles to 60% or more, preferably 70% or more, and more preferably 80% or more, of the thickness thereof immediately after heat expansion. Further, the amount thereof is about from 1 to 100 parts by weight, preferably from 5 to 40 parts by weight, and more preferably from 10 to 20 parts by weight, based on 100 parts by weight of the base polymer.

The thickness of the pressure-sensitive adhesive layer 12 is preferably about from 1 μm to 200 μm, and more preferably about from 3 μm to 50 μm, in terms of compatibility of adhesion fixability with releasability. Further, the adhesive force of the pressure-sensitive adhesive layer 12 is not particularly limited, so long as it is within the range in which the pressure-sensitive adhesive layer is finally easily separable from a support wafer. For example, the value of the 180° peel adhesive force to a semiconductor wafer is preferably within a range of 1 to 30 N/10 mm, and more preferably within a range of 5 to 20 N/10 mm.

The formation of the pressure-sensitive adhesive layer 12 on the base material film 11 is performed, for example, by applying an adhesive-containing composition, followed by drying (performing heat crosslinking as needed). Coating systems include roll coating, screen coating, and gravure coating. Further, coating may be directly made on the base material, or the composition may be applied onto release paper whose surface is subjected to release treatment, followed by transfer thereof to the base material. Subsequently, the separator 13 described later is stuck onto the surface of the pressure-sensitive adhesive layer 12, whereby the pressure-sensitive adhesive sheet 10 according to this embodiment can be obtained.

When the pressure-sensitive adhesive layer 12 is composed of the radiation-curable adhesive such as the ultraviolet-curable adhesive, the base material film 11 is required to have sufficient radiation permeability, because the pressure-sensitive adhesive layer 12 is irradiated with a radiation before or after dicing.

The above-mentioned separator 13 may be optionally provided for label processing or for the purpose of smoothing the surface of the pressure-sensitive adhesive layer 12. Constituent materials of the separator 13 include paper, a film of a synthetic resin such as polyethylene, polypropylene or polyethylene terephthalate, and the like. In order to enhance releasability from the pressure-sensitive adhesive layer 12, release treatment such as silicone treatment, long-chain alkyl treatment or fluorine treatment may be optionally performed to a surface of the separator 13. Further, ultraviolet prevention treatment may be optionally performed so that the pressure-sensitive adhesive sheet does not react with environmental ultraviolet rays. The thickness of the separator 13 is usually about from 10 to 200 μm, and preferably about from 25 to 100 μm.

A processing method of a processed material using the pressure-sensitive adhesive sheet 10 according to this embodiment will be described below. In the following description, the case where a semiconductor wafer is used as the processed material is taken as an example.

The pressure-sensitive adhesive sheet 10 of the invention is stuck onto the semiconductor wafer such as a semiconductor part (a mounting step), and then, mainly used in a dicing step and a pickup step. In the mounting step, the pressure-sensitive adhesive sheet 10 is laminated on the semiconductor wafer so that the pressure-sensitive adhesive layer 12 is stuck onto the semiconductor wafer, and pressed with a pressing means such as a pressure roll. Further, sticking can also be performed by laminating the semiconductor wafer and the pressure-sensitive adhesive sheet 10 as described above in a pressurizable container (for example, an autoclave), and pressurizing the inside of the container. In this case, the pressure-sensitive adhesive sheet 10 may be stuck onto the semiconductor wafer while pressing with the pressing means. Further, sticking can also be performed in a vacuum chamber in the same manner as described above. Although the sticking temperature in sticking is not limited at all, it is preferably from 20 to 80° C.

The dicing step is performed for cutting the semiconductor wafer to individual pieces to produce semiconductor chips (small pieces of a processed material). The dicing is performed, for example, from the circuit face side of the semiconductor wafer by a conventional method. In the dicing step, a blade is allowed to rotate at high speed, and the semiconductor wafer is cut therewith to a specified size. Further, in this step, there can be used, for example, a cutting system called full cutting where cutting is performed into the pressure-sensitive adhesive sheet 10. A dicing apparatus used in this step is not particularly limited, and conventional may be used. Further, the semiconductor wafer is adhered and fixed by the pressure-sensitive adhesive sheet 10, so that chip cracking and chip flying can be inhibited, and breakage of the semiconductor wafer can also be inhibited.

Then, the pressure-sensitive adhesive sheet 10 is expanded. The expanding is performed using a conventional expanding apparatus, after the pressure-sensitive adhesive sheet 10 has been optionally irradiated with a radiation. The expanding apparatus includes a doughnut-shaped outer ring which can push the pressure-sensitive adhesive sheet 10 downward through a dicing ring, and an inner ring which has a diameter smaller than that of the outer ring and supports the pressure-sensitive adhesive sheet 10. In this embodiment, the pressure-sensitive adhesive sheet 10 excellent in expandability is used, so that the spacing between the semiconductor chips adjacent to each other can be sufficiently increased without breakage of the base material film 11. As a result, at the time of picking up, the semiconductor chips can be prevented from coming into contact with each other to damage.

The semiconductor chip is picked up for separating the semiconductor chip adhered and fixed to the pressure-sensitive adhesive sheet 10. A pickup method is not particularly limited, and various conventional methods can be employed. Examples thereof include a method of pushing up the individual semiconductor chip from the pressure-sensitive adhesive sheet 10 side with a needle, and picking up the pushed-up semiconductor chip with a pickup apparatus.

When the pressure-sensitive adhesive sheet 10 having the radiation-curable adhesive layer or the heat-releasable adhesive layer is used herein, the pressure-sensitive adhesive layer 12 may be subjected to irradiation of a radiation or heat treatment. By doing so, adhesion is decreased thereby intending to make pickup easy. In the case of the radiation-curable adhesive layer, conditions such as irradiation intensity and irradiation time at the time of irradiation of a radiation are not particularly limited, and may be appropriately set as needed. Further, in the case of heat-releasable adhesive layer, the pressure-sensitive adhesive layer expands by heat-foaming or heat-expandable component upon heating thereof, whereby the adhered area with the semiconductor chip can be significantly decreased. Accordingly, the adhesive force of the pressure-sensitive adhesive sheet 10 to the semiconductor chip is decreased, which makes it easy to separate the pressure-sensitive adhesive sheet 10 from the semiconductor chip. As a result, the pickup become possible without damaging the semiconductor chip. Heating conditions such as heating temperature and heating time at the time when the heat treatment is conducted are not particularly limited, and may be appropriately set as needed.

In the above description, the description of the pressure-sensitive adhesive sheet according to the invention was given taking as an example the case where the semiconductor wafer was used as the processed material. However, the pressure-sensitive adhesive sheet for dicing according to the invention should not be construed as being limited thereto, and is also applicable for dicing of a semiconductor package, a glass, a ceramic or the like.

EXAMPLES

Preferred examples of the invention will be illustratively described in detail below. However, materials, amounts thereof blended and the like described in the examples are for illustrative purpose only, and do not intend to limit the scope of the invention thereto only, unless otherwise specified.

Example 1

As a base material, there was used RB film (trade name, thickness: 100 μm) manufactured by JSR Corporation. The above-mentioned base material is a hydrogenated polybutadiene film, and the composition ratio of block (I) containing the above-mentioned structural formula (A) as a main constitutional component to block (II) containing the above-mentioned structural formula (B) as a main constitutional component in the whole film polymer is 50:50 in terms of weight ratio. The ratio of the above-mentioned structural formula (A) to the above-mentioned structural formula (B) contained in block (I) is 80:20 in terms of weight ratio, and the ratio of the above-mentioned structural formula (A) to the above-mentioned structural formula (B) contained in block (II) is 20:80 in terms of weight ratio. The crystallinity of the base material measured by X-ray diffraction was 30%.

To a solution containing an acrylic copolymer having a weight average molecular weight of 500,000 which was obtained by copolymerizing 90 parts by weight of butyl acrylate and 10 parts by weight of acrylic acid in toluene by a conventional method, there were added 80 parts by weight of dipentaerythritol hexaacrylate (Kayarad DPHA (trade name) manufactured by Nippon Kayaku Co., Ltd), 5 parts by weight of a photopolymerization initiator (Irgacure 184 (trade name) manufactured by Ciba Specialty Chemicals) and 5 parts by weight of a polyisocyanate compound (Colonate (trade name) manufactured by Nippon Urethane Co., Ltd.) to prepare an acrylic ultraviolet-curable adhesive solution.

The adhesive solution prepared above was applied onto a corona-treated surface of the base material and crosslinked by heat at 80° C. for 10 minutes to form an ultraviolet-curable pressure-sensitive adhesive layer having a thickness of 10 μm. Then, a separator was stuck to the pressure-sensitive adhesive layer side to prepare an ultraviolet-curable pressure-sensitive adhesive sheet for dicing.

Comparative Example 1

In this Comparative Example, an ultraviolet-curable adhesive sheet for dicing was prepared in the same manner as in Example 1 with the exception that a base material film obtained by forming an ethylene-methacrylic acid copolymer (MFR=2.0) to a film having a thickness of 100 μm by a T-die extrusion method was used as the base material.

Comparative Example 2

In this Comparative Example, an ultraviolet-curable adhesive sheet for dicing was prepared in the same manner as in Example 1 with the exception that a base material film obtained by forming an olefinic thermoplastic elastomer (Zelas 5053 (trade name) manufactured by Mitsubishi Chemical Corporation) (MFR=6.8) to a film having a thickness of 100 μm by a T-die extrusion method was used as the base material.

Evaluation Tests

The respective pressure-sensitive adhesive sheets for dicing obtained in Example and Comparative Examples were evaluated by the following methods:

(1) Evaluation of Dicing Properties

A six-inch semiconductor wafer having a thickness of 350 μm was mounted on the pressure-sensitive adhesive sheet for dicing, and then diced under the following conditions:

<Dicing Conditions>

Dicer: DFD-651 manufactured by DISCO Co., Ltd.

Blade: NBC-ZH2050 27HEDD manufactured by DISCO Co., Ltd.

Number of Revolutions of Blade: 45,000 rpm

Dicing Rate: 100 mm/sec

Dicing Depth: 30 μm in the base film

Dicing Size: 2.5 mm×2.5 mm

Cut mode: Down cut

After dicing, the state of the occurrence of fibrous scraps on a surface of each semiconductor chip obtained by cutting of the semiconductor wafer was observed under an optical microscope (at 200-fold magnification). In this observation, the number of fibrous scraps was counted for each size of the fibrous scraps. The results thereof are shown in the following Table 1.

(2) Evaluation of Expandability

After dicing, the pressure-sensitive adhesive sheet for dicing was subjected to ultraviolet irradiation with an ultraviolet irradiator. Then, expanding was performed with a die bonder under the following conditions;

<Expanding Conditions>

Die Bonder: GPS-100 manufactured by NEC Machinery Corporation

Shape of Inner Ring: E-bearing type

Pull-Down Amount: 7 mm, 12 mm

It was visually observed whether breakage of the pressure-sensitive adhesive sheet for dicing occurred or not by expanding. The results thereof are shown in the following Table 1.

Results

As seen from the following Table 1, it was confirmed that no fibrous scraps were generated in the pressure-sensitive adhesive sheet for dicing of Example 1. Further, it was also confirmed that the pressure-sensitive adhesive sheet for dicing did not break at the time of expanding. That is to say, it was found that the pressure-sensitive adhesive sheet for dicing according to Example 1 could inhibit the generation of fibrous scraps, and was also excellent in expandability. In contrast, the pressure-sensitive adhesive sheet for dicing of Comparative Example 1 did not break when the pull-down amount was 7 mm, but broke when the pull-down amount was 12 mm. Further, it was confirmed that fibrous scraps were also generated. Furthermore, in the pressure-sensitive adhesive sheet for dicing of Comparative Example 2, no fibrous scraps were generated, but it was confirmed that the base material film broke in the course of expanding.

While the present invention has been described in detail and with reference to specific embodiments thereof, it will be apparent to one skilled in the art that various changes and modifications can be made therein without departing from the scope thereof.

This application is based on Japanese patent application No. 2006-154717 filed Jun. 2, 2006, the entire contents thereof being hereby incorporated by reference.

Further, all references cited herein are incorporated in their entireties.

What is claimed is:

1. A pressure-sensitive adhesive sheet for dicing, which comprises a base material and at least one pressure-sensitive adhesive layer disposed on at least one surface of the base material, wherein the base material contains a polymer having a random copolymer block, and wherein the random copolymer block contains:

a block (I) containing, as a main constitutional unit, a constitutional unit represented by the following structural formula (A):

and a block (II) containing, as a main constitutional unit, a constitutional unit represented by the following structural formula (B):

wherein the block (I) is a random copolymer block including the constitutional unit represented by the structural formula (A) and the constitutional unit represented by the structural formula (B), and wherein the constitutional unit represented by the structural formula (A) is contained in an amount within a range of from 65 to 95% by weight, and the constitutional unit represented by the structural formula (B) is contained in an amount within a range of from 5 to 35% by weight, and wherein the block (II) is a random copolymer block including the constitutional unit represented by the structural formula (A) and the constitutional unit represented by the structural formula (B), and wherein the constitutional unit represented by structural formula (A) is con-

TABLE 1

| | | Number of Fibrous Scraps for Each Size (μm) | | | Occurrence of Breakage in Each Pull-Down Amount | |
|---|---|---|---|---|---|---|
| | Crystallinity (%) | Less than 100 μm | From 100 to 500 μm | 500 μm or more | 7 mm | 12 mm |
| Example 1 | 30 | 0 | 0 | 0 | Not occurred | Not occurred |
| Comparative Example 1 | 12 | 100 or more | 100 or more | 67 | Not occurred | Occurred |
| Comparative Example 2 | 45 | 0 | 0 | 0 | Occurred | Occurred | tained in an amount within a range of from 5 to 35% by weight, and the constitutional unit represented by structural formula (B) is contained in an amount within a range of from 65 to 95% by weight.

2. The pressure-sensitive adhesive sheet according to claim 1, wherein the block (I) and the block (II) are each contained in an amount within a range of from 30 to 70% by weight based on the weight of the polymer.

3. The pressure-sensitive adhesive sheet according to claim 1, wherein the base material has a crystallinity of from 10 to 50% by weight.

4. The pressure-sensitive adhesive sheet according to claim 1, wherein the base material is composed of a monolayer film, and contains the polymer in an amount of 50% by weight or more based on the total weight of the base material.

5. The pressure-sensitive adhesive sheet according to claim 1, wherein the base material is composed of a multilayer film, and at least one layer of the multilayer film contains the polymer in an amount of 50% by weight or more based on the total weight of the layer.

6. The pressure-sensitive adhesive sheet according to claim 1, wherein the pressure-sensitive adhesive layer contains a radiation-curable adhesive.

7. The pressure-sensitive adhesive sheet according to claim 6, further comprising a layer which allows a radiation to at least partially permeate.

8. The pressure-sensitive adhesive sheet according to claim 1, wherein the base material is a base material obtainable by polymerizing 1,3-butadiene as a main raw material monomer of the block (I) and 1,2-butadiene as a main raw material monomer of the block (II), followed by conducting a hydrogenation.

9. The pressure-sensitive adhesive sheet according to claim 1, further comprising an antistatic layer on the base material.

10. The pressure-sensitive adhesive sheet according to claim 9, wherein the antistatic layer is made of a conductive material.

11. The pressure-sensitive adhesive sheet according to claim 10, wherein the conductive material is a metal, an alloy, or an oxide.

12. The pressure-sensitive adhesive sheet according to claim 1, wherein the pressure-sensitive adhesive layer comprises fine heat-expandable particles having an average particle size of 1 to 25 μm.

13. A method for processing a processed material, which comprises performing dicing of the processed material to which a pressure-sensitive adhesive sheet for dicing is stuck, thereby forming pieces of the processed material,
wherein the pressure-sensitive adhesive sheet comprises a base material and at least one pressure-sensitive adhesive layer disposed on at least one surface of the base material,
wherein the base material contains a polymer having a random copolymer block, and
wherein the random copolymer block contains:
a block (I) containing, as a main constitutional unit, a constitutional unit represented by the following structural formula (A):

and a block (II) containing, as a main constitutional unit, a constitutional unit represented by the following structural formula (B):

wherein the block (I) is a random copolymer block including the constitutional unit represented by the structural formula (A) and the constitutional unit represented by the structural formula (B), and wherein the constitutional unit represented by the structural formula A) is contained in an amount within a range of from 65 to 95% by weight, and the constitutional unit represented by the structural formula (B) is contained in an amount within a range of from 5 to 35% by weight, and
wherein the block (II) is a random copolymer block including the constitutional unit represented by the structural formula (A) and the constitutional unit represented by the structural formula (B), and wherein the constitutional unit represented by structural formula (A) is contained in an amount within a range of from 5 to 35% by weight, and the constitutional unit represented by structural formula (B) is contained in an amount within a range of from 65 to 95% by weight.

14. The method according to claim 13, which further comprises expanding the pressure-sensitive adhesive sheet after the dicing, and then picking up the pieces of the processed material after the dicing from the pressure-sensitive adhesive sheet.

15. The method according to claim 13, wherein the processed material is a semiconductor element.

* * * * *